(12) United States Patent  (10) Patent No.: US 7,688,159 B2
Omura et al.  (45) Date of Patent: Mar. 30, 2010

(54) SAW DUPLEXER HAVING A BRIDGING INDUCTOR IN A MULTILAYER PACKAGE

(75) Inventors: Masashi Omura, Yasu (JP); Norio Taniguchi, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 151 days.

(21) Appl. No.: 11/942,562

(22) Filed: Nov. 19, 2007

(65) Prior Publication Data
US 2008/0061906 A1 Mar. 13, 2008

Related U.S. Application Data

(63) Continuation of application No. PCT/JP2006/310739, filed on May 30, 2006.

(30) Foreign Application Priority Data
Jun. 21, 2005 (JP) ............................. 2005-180717

(51) Int. Cl.
H03H 9/72 (2006.01)
H01F 27/28 (2006.01)
H01F 5/04 (2006.01)
(52) U.S. Cl. ........................ 333/133; 333/193; 336/200; 336/232
(58) Field of Classification Search ................. 333/133, 333/193–196, 185; 336/180, 184, 200, 223, 336/225, 229–232
See application file for complete search history.

(56) References Cited

U.S. PATENT DOCUMENTS

| 5,612,660 | A | 3/1997 | Takimoto |
| 5,859,473 | A | 1/1999 | Ikata et al. |
| 6,201,457 | B1 * | 3/2001 | Hickernell ................. 333/193 |
| 6,750,737 | B2 * | 6/2004 | Uriu et al. ................... 333/133 |
| 6,882,250 | B2 | 4/2005 | Uriu et al. |
| 6,885,260 | B2 * | 4/2005 | Nishimura et al. .......... 333/133 |
| 6,943,645 | B2 | 9/2005 | Taniguchi |

(Continued)

FOREIGN PATENT DOCUMENTS

JP 09-167937 A 6/1997

(Continued)

OTHER PUBLICATIONS

Machine translation of JP 2001-308538, published Nov. 2, 2001.*

(Continued)

*Primary Examiner*—Barbara Summons
(74) *Attorney, Agent, or Firm*—Keating & Bennett, LLP

(57) ABSTRACT

A SAW duplexer includes a first SAW filter having a passband with a relatively low frequency, and a second SAW filter having a passband with a relatively high frequency. The first and second SAW filters each have a ladder-shaped circuit configuration. A bridging inductor is connected in parallel to at least one serial arm resonator in the second SAW filter. The bridging inductor includes a coiled portion provided on a multilayer package substrate. The coiled portion is defined by connecting first to third wires provided on first to third layers by via-hole conductors. First, third, and fifth via-hole conductors that define a coil return wire portion are disposed inside the coiled portion.

7 Claims, 13 Drawing Sheets

U.S. PATENT DOCUMENTS 7,276,992 B2 10/2007 Iwamoto et al.
2003/0214368 A1* 11/2003 Taniguchi ................... 333/133

FOREIGN PATENT DOCUMENTS

| JP | 2001-308538 | * | 11/2001 |
|---|---|---|---|
| JP | 2002-261581 | A | 9/2002 |
| JP | 2003-304139 | A | 10/2003 |
| JP | 2005-109097 | A | 4/2005 |

OTHER PUBLICATIONS

Official communication issued in the International Application No. PCT/JP2006/310739, mailed on Sep. 12, 2006.

* cited by examiner

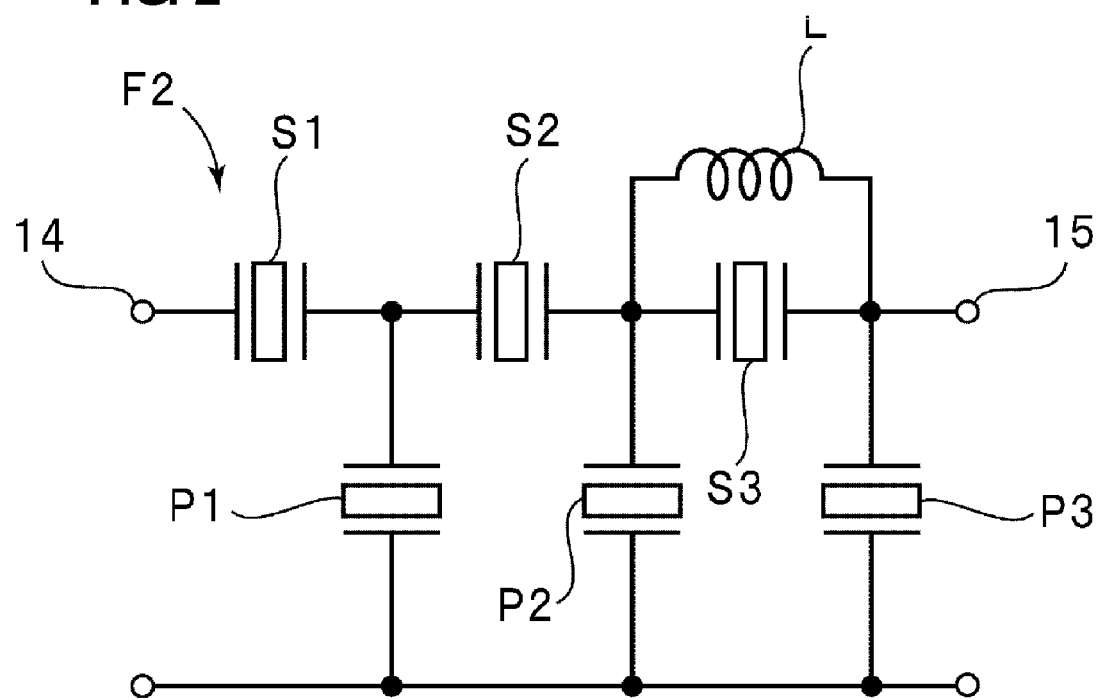

SAW DUPLEXER HAVING A BRIDGING INDUCTOR IN A MULTILAYER PACKAGE

BACKGROUND OF THE INVENTION

1. Field of the Invention

The present invention relates to a SAW duplexer including first and second SAW filters having different passbands, and more particularly, to a SAW duplexer in which first and second SAW filters each have a ladder-shaped circuit configuration and a bridging inductor is connected in parallel to a serial arm resonator in at least one of the SAW filters.

2. Description of the Related Art

In recent mobile telephones or the like, SAW duplexers including first and second SAW filters having different passbands are widely used. Japanese Unexamined Patent Application Publication No. 2003-332885 discloses an example of such a SAW duplexer.

FIG. 16 shows a circuit configuration of a SAW duplexer described in Japanese Unexamined Patent Application Publication No. 2003-332885. A SAW duplexer 101 is connected to an antenna 102. That is, a first SAW filter 111 and a second SAW filter 112 are connected to the antenna 102. The first SAW filter 111 and the second SAW filter 112 are different in passband. Each of the SAW filters 111 and 112 has a ladder-shaped circuit configuration including serial arm resonators and parallel arm resonators.

That is, the first SAW filter 111 includes serial arm resonators S1 to S3 and parallel arm resonators P1 and P2. Similarly, the second SAW filter 112 includes serial arm resonators S4 to S6 and parallel arm resonators P3 and P4.

Bridging inductors L1 and L2 are connected in parallel to the serial arm resonators S3 and S5, respectively. The bridging inductor L1 is provided to obtain a sufficient attenuation in the passband of the opposite SAW filter 112. Similarly, the bridging inductor L2 is inserted to obtain a sufficient attenuation in the passband of the opposite SAW filter 111.

In the SAW duplexer 101, a surface acoustic wave element chip is mounted on a package substrate. FIG. 17 is a plan view of a surface acoustic wave element chip 113. In the surface acoustic wave element chip 113, the SAW filters 111 and 112 are formed by placing a plurality of illustrated electrodes on a piezoelectric substrate 114.

The bridging inductors L1 and L2 are not provided in the surface acoustic wave element chip 113. That is, coil-shaped electrode patterns for forming the bridging inductors L1 and L2 are provided on an upper surface of a package substrate 115 shown in FIG. 18.

A plurality of electrode lands electrically connected to the surface acoustic wave element chip 113 are provided on the upper surface of the package substrate 115. Electrode lands A1 and A2 of the electrode lands are connected to the bridging inductor L1. Bumps electrically connected to both ends of the serial arm resonator S3 in the surface acoustic wave element chip 113 are joined to the electrode lands A1 and A2, respectively. Similarly, the bridging inductor L2 is electrically connected to electrode lands A3 and A4 on the package substrate 115. The electrode lands A3 and A4 correspond to portions joined to metal bumps that are connected to both ends of the serial arm resonator S5 provided in the surface acoustic wave element chip 113.

That is, in the SAW duplexer 101, the bridging inductors L1 and L2 are obtained by forming coil-shaped electrode patterns on the upper surface of the package substrate 115 on which the surface acoustic wave element chip is mounted.

Japanese Unexamined Patent Application Publication No. 2003-304139 discloses a package for a surface acoustic wave duplexer. In this package for a surface acoustic wave duplexer, phase-matching circuit electrodes are provided to adjust the phase characteristic of a surface acoustic wave filter mounted in the package. In Japanese Unexamined Patent Application Publication No. 2003-304139, a plurality of electrodes shaped like spiral patterns are described as defining the above-described phase-matching circuit electrodes. The spirally patterned electrodes are provided on a plurality of layers, and are electrically connected to each other by a via-hole electrode.

As described above, in the SAW duplexer described in Japanese Unexamined Patent Application Publication No. 2003-332885, the bridging inductors L1 and L2 are connected to increase the attenuation in the passband of the opposite filter in the filter characteristics of the first and second SAW filters 111 and 112. However, the bridging inductors L1 and L2 are provided by forming coil-shaped electrodes on the upper surface of the package substrate on which the surface acoustic wave element chip is mounted. For this reason, as is evident from FIG. 18, it is necessary to prepare, as the package substrate 115, a large substrate that allows coil-shaped electrode patterns to be formed on the upper surface thereof.

The above-described Japanese Unexamined Patent Application Publication No. 2003-304139 discloses the structure in which spirally patterned electrodes are provided as the phase-matching electrodes on a plurality of layers in the SAW duplexer package. However, in Japanese Unexamined Patent Application Publication No. 2003-304139, the spirally patterned electrodes are simply provided as the phase-matching electrodes, but Japanese Unexamined Patent Application Publication No. 2003-304139 does not specifically refer to the bridging inductor L in the SAW duplexer. While the spirally patterned electrodes serving as the phase-matching circuit electrodes are spiral, the characteristic required of the phase-matching electrodes is completely different from the characteristic required of the bridging inductor.

That is, it is preferable that the bridging inductor have a large inductance and be of a lumped-constant type. In contrast, the phase-matching circuit electrode serves to perform phase matching, and shows a distributed-constant behavior. The length of the spirally patterned electrode is defined by the phase change amount. Therefore, Japanese Unexamined Patent Application Publication No. 2003-304139 describes the structure in which the spiral electrodes are provided on a plurality of layers, but does not disclose the electrode structure that can be used as a bridging inductor in the SAW duplexer.

SUMMARY OF THE INVENTION

In order to overcome the problems described above, preferred embodiments of the present invention provide a SAW duplexer in which first and second SAW filters having different passbands each have a ladder-shaped circuit configuration, in which a bridging inductor is connected in parallel to a serial arm resonator in at least one of the SAW filters, in which the filter characteristic is improved by connection of the bridging inductor, and in which size reduction can be achieved even when the bridging inductor is connected.

A SAW duplexer according to a preferred embodiment of the present invention includes a first SAW filter having a ladder-shaped circuit configuration including at least one serial arm resonator and at least one parallel arm resonator, and having a passband with a relatively low frequency; a second SAW filter having a ladder-shaped circuit configuration including at least one serial arm resonator and at least one parallel arm resonator, and having a passband with a relatively high frequency; and a bridging inductor connected in parallel to the at least one serial arm resonator in the second SAW filter. The first SAW filter and the second SAW filter are preferably provided as SAW filter chips. The SAW duplexer further includes a multilayer package substrate on which the SAW filter chips are mounted. The bridging inductor includes a first wire provided on a first layer of the multilayer package substrate, a first via-hole conductor connected to one end of the first wire, a second via-hole conductor connected to the other end of the first wire, and a second wire provided on a second layer of the multilayer package substrate at a height that is different from a height of the first layer and connected at one end to the second via-hole conductor. A coil return wire portion including at least the first via-hole conductor is disposed inside a coiled portion including the first wire and the second wire.

The SAW duplexer according to a preferred embodiment of the present invention further includes a third via-hole conductor connected to the first via-hole conductor, a fourth via-hole conductor connected to the other end of the second wire, and a third wire connected at one end to the fourth via-hole conductor and provided on a third layer of the multilayer package substrate at a height that is different from the heights of the first and second layers. The return wire portion includes the first and third via-hole conductors, the coiled portion includes the first to third wires, and the return wire portion is disposed inside the coiled portion.

In the SAW duplexer according to another specific preferred embodiment of the present invention, a fifth via-hole conductor is connected at one end to the third via-hole conductor, and a sixth via-hole conductor is connected at one end to the other end of the third wire. The other ends of the fifth via-hole conductor and the sixth via-hole conductor reach a fourth layer provided at a height different from the heights of the first to third layers.

In the SAW duplexer according to a further preferred embodiment of the present invention, the sixth via-hole conductor is disposed inside the coiled portion.

In the SAW duplexer according to another preferred embodiment of the present invention, the return wire portion includes a plurality of via-hole conductors, and the via-hole conductors are linearly connected in the return wire portion.

In the SAW duplexer according to a further preferred embodiment of the present invention, the return wire portion includes a plurality of via-hole conductors, and the via-hole conductors are connected so as not to form a straight line in the return wire portion.

In the SAW duplexer according to a further preferred embodiment of the present invention, a via-hole conductor connected to a ground potential is disposed between the wires that form the bridging inductor and a portion of the multilayer package substrate on which the first SAW filter chip is mounted.

In the SAW duplexer according to a further preferred embodiment of the present invention, an electrical connecting portion of the package connected to a terminal of the serial arm resonator to which the bridging inductor is connected is disposed inside the coiled portion of the bridging inductor in the second SAW filter.

In the SAW duplexer according to a preferred embodiment of the present invention, the first and second SAW filters are mounted as SAW filter chips on the multilayer package substrate. In the first and second SAW filters each having a ladder-shaped circuit configuration, the bridging inductor is connected in parallel to at least one serial arm resonator in the second SAW filter. The bridging inductor has the coiled portion including the first wire and the second wire provided on at least the first and second layers of the multilayer package substrate. The coil return wire portion including at least the first via-hole conductor is disposed inside the coiled portion. Therefore, the area of a region where the bridging inductor is provided can be reduced. That is, the coiled portion is divided into a plurality of layers so as to include at least the first and second wires, and the coil return wire portion is disposed inside the coiled portion. This can significantly reduce the area of the region where the bridging inductor is provided.

Therefore, in the filter characteristic of at least the second SAW filter to which the bridging inductor is connected, the attenuation in the passband of the first SAW filter serving as the opposite filter can be sufficiently increased, and size reduction of the SAW duplexer can be achieved.

In preferred embodiments of the present invention, when the third wire is provided on the third layer provided at a height that is different from the heights of the first and second layers and the coiled portion is defined by the first to third wires, the area of the region where the bridging inductor is provided can be further reduced, or the bridging inductor having a large inductance can be formed without increasing the area of the multilayer package substrate.

When the other ends of the fifth and sixth via-hole conductors reach the fourth layer, a wire that electrically connects the fifth via-hole conductor and one end of the serial arm resonator and a wire that electrically connects the sixth via-hole conductor and the other end of the serial arm resonator can be provided on the fourth layer. This can reduce the area needed for the wiring structure.

When the sixth via-hole conductor is disposed inside the coiled portion, the SAW duplexer having the sixth via-hole conductor can be provided while achieving size reduction because the area of the multilayer package substrate is not increased by formation of the sixth via-hole conductor.

When a plurality of via-hole conductors that define the return wire portion are linearly connected in the return wire portion, the area occupied by the inductor can be reduced further.

In the return wire portion, the via-hole conductors may be connected so as not to form a straight line. In this case, the degree of flexibility in wiring can be increased.

When the via-hole conductor connected to the ground terminal is disposed between the wires that define the bridging inductor and the portion of the multilayer package substrate on which the first SAW filter chip is mounted, isolation between the first SAW filter and the second SAW filter can be increased.

When the electrical connecting portion of the package connected to the terminal of the serial arm resonator to which the bridging inductor is connected is disposed inside the coiled portion of the bridging inductor in the second SAW filter, it can be formed without increasing the area of the multilayer package substrate. Therefore, the size of the SAW duplexer can be reduced further.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 2 is a view showing a circuit configuration of a second SAW filter in the SAW duplexer according to a preferred embodiment of the present invention.

DETAILED DESCRIPTION OF THE PREFERRED EMBODIMENTS

The present invention will be explained by the following description of specific preferred embodiments of the present invention with reference to the drawings.

Figure 1:
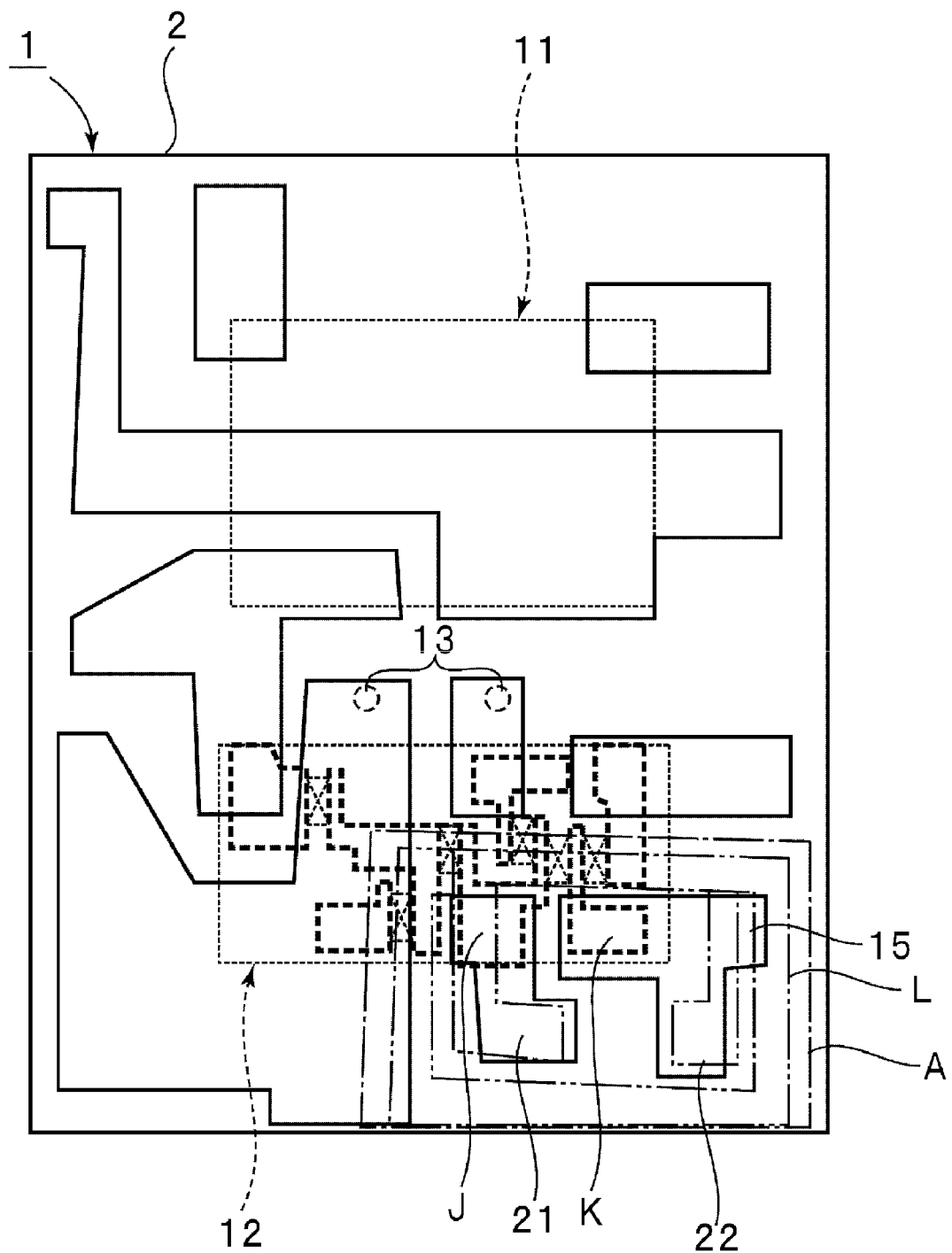
FIG. 1 is a schematic plan view explaining a SAW duplexer according to a preferred embodiment of the present invention.

FIG. 1 is a schematic plan view of a SAW duplexer according to a preferred embodiment of the present invention.

A SAW duplexer 1 preferably includes a multilayer package substrate 2. The multilayer package substrate 2 is formed by a multilayer ceramic substrate. The multilayer package substrate 2 may be formed of an insulating material other than ceramics.

A first SAW filter chip 11 and a second SAW filter chip 12 are mounted on the multilayer package substrate 2 by flip chip bonding, as shown by broken lines. That is, the SAW filter chips 11 and 12 are mounted on an upper surface of the multilayer package substrate 2 with metal bumps. In FIG. 1, outlines of the SAW filter chips 11 and 12 are shown by broken lines, as described above.

Illustrated electrodes are provided on the upper surface of the multilayer package substrate 2. The first and second SAW filter chips 11 and 12 respectively define first and second SAW filters F1 and F2 in the SAW duplexer 1. In this preferred embodiment, the frequency of the passband of the first SAW filter F1 is relatively low, and the frequency of the passband of the second SAW filter F2 is relatively high. That is, the first SAW filter 11 may be used as a transmission-side bandpass filter of a mobile telephone, and the second SAW filter F2 may be used as a receiving-side bandpass filter.

Each of the first and second SAW filters F1 and F2 has a ladder-shaped circuit configuration. FIG. 2 shows a circuit configuration of the second SAW filter F2.

In the second SAW filter F2, serial arm resonators S1, S2, and S3 are inserted in a serial arm. Three parallel arms are provided between the serial arm and a ground potential, and parallel arm resonators P1, P2, and P3 are inserted in the parallel arms, respectively.

In other words, the serial arm resonators S1 to S3 and the parallel arm resonators P1 to P3 are alternately arranged from an input terminal 14 toward an output terminal 15. In the ladder-shaped circuit, the numbers of serial arm resonators and parallel arm resonators are not particularly limited. The first SAW filter F1 has a similar ladder-shaped circuit configuration.

In this preferred embodiment, the first and second SAW filters having the above-described ladder-shaped circuit configuration are commonly connected at one end, and are connected to an unillustrated antenna. On the other hand, the other end of the first SAW filter F1 serves as a transmission terminal, and the other end of the second SAW filter F2 serves as a receiving terminal. This configuration itself of the SAW duplexer is known prior to the filing of this application, as described in Japanese Unexamined Patent Application Publication No. 2003-332885, which is described above.

As shown in FIG. 2, a bridging inductor L is connected in parallel to the serial arm resonator S3 in the second SAW filter F2. In the filter characteristic of the second SAW filter, the bridging inductor L is connected so as to increase the attenuation in the passband of the opposite first SAW filter F1 and the attenuation in the stop band in the low section of the passband of the second SAW filter F2, and to increase the bandwidth in the high section of the passband of the second SAW filter F2.

One of the unique features of the present preferred embodiment is that the bridging inductor L is provided on the multilayer package substrate 2 without increasing the area of the multilayer package substrate 2. This will be described with reference to FIGS. 1 and 3A to 6D.

Figure 3A:
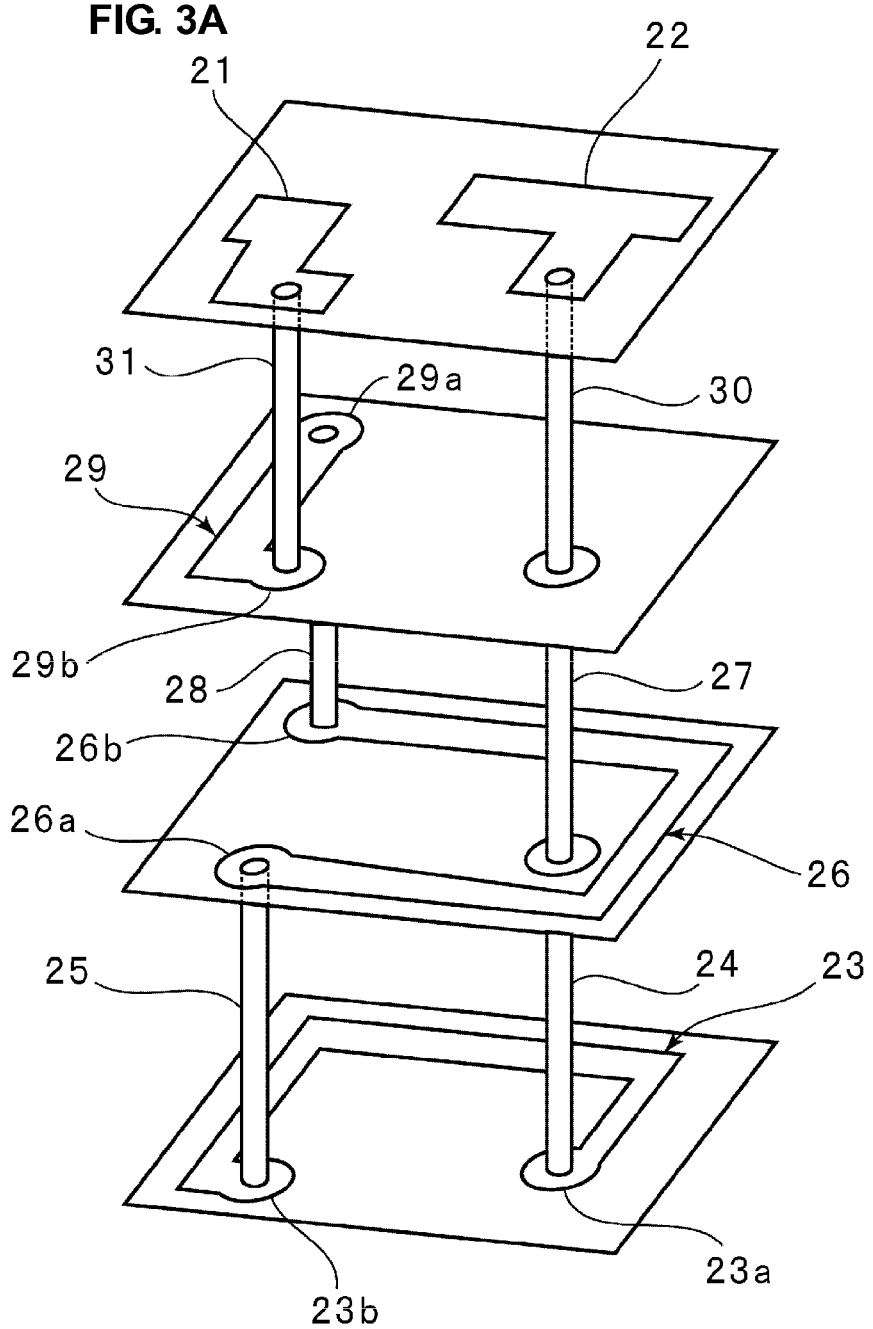
FIG. 3A is an exploded perspective view schematically showing a region where a bridging inductor is provided in the SAW duplexer according to a preferred embodiment of the present invention.

On the multilayer package substrate 2 shown in FIG. 1, a region where the bridging inductor L is provided is shown by a one-dot chain line A. That is, the bridging inductor L is provided in the region shown by the one-dot chain line A. FIG. 3A is an exploded perspective view of the region where the bridging inductor L is provided. FIGS. 3A, 3B and FIGS. 4A to 4D are plan views or cross-sectional plan views taken at different heights.

As shown in FIG. 3A and FIGS. 4A to 4D, electrodes are provided on first to fourth layers provided at different heights in the multilayer package substrate 2. The first to fourth layers are flat surfaces provided at different heights in the multilayer package substrate 2, and are arranged from the bottom in that order. The fourth layer corresponds to the upper surface of the multilayer package substrate 2.

As shown in FIG. 3A, electrode lands 21 and 22 are provided on the upper surface of the multilayer package substrate 2, that is, on the fourth layer. The electrode lands 21 and 22 are formed on the upper surface of the multilayer package substrate 2 by forming an appropriate conductive film and patterning the film. The electrode lands 21 and 22 correspond to the terminals at both ends of the bridging inductor L in the circuit configuration shown in FIG. 2. The electrode lands 21 and 22 correspond to portions that are electrically connected to both ends of the serial arm resonator S3 when the SAW filter chip 12 including the second SAW filter F2 is mounted.

A first wire 23 is provided on the first layer below the electrode lands 21 and 22. The first wire 23 is substantially C-shaped or substantially angularly U-shaped in plan view. A via cover 23a at a first end of the first wire 23 is electrically connected to a lower end of a first via-hole conductor 24. On the other hand, a via cover 23b at a second end of the first wire 23 is electrically connected to a lower end of a second via-hole conductor 25. A via cover refers to a wire portion that is electrically connected to a via-hole conductor and that has an area larger than that of the via-hole conductor. The first wire 23 has the via covers 23a and 23b at the ends thereof so as to be connected to the first and second via-hole conductors 24 and 25 at the ends.

An upper end of the second via-hole conductor 25 reaches the second layer, and is electrically connected to a via cover 26a at one end of a second wire 26 provided on the second layer. The second wire 26 is substantially C-shaped or substantially angularly U-shaped, and has a via cover 26b at a second end.

The first via-hole conductor 24 is electrically connected to a third via-hole conductor 27 that extends from the second layer to the third layer. The first and third via-hole conductors 24 and 27 are separated from the second wire 26 provided on the second layer, and are disposed so as not to be electrically connected to the second wire 26.

A lower end of a fourth via-hole conductor 28 is electrically connected to the via cover 26b, that is, to the second wire 26. The fourth via-hole conductor 28 extends from the second layer to the third layer, and is electrically connected to a via cover 29a at one end of a third wire 29 provided on the third layer.

The third wire 29 is substantially L-shaped, and has a via cover 29b at an end opposite to the via cover 29a. The via cover 29b is disposed directly under the electrode land 21.

Fifth and sixth via-hole conductors 30 and 31 extend from the third layer to the fourth layer. The fifth via-hole conductor 30 is disposed to form a straight line with the first and third via-hole conductors 24 and 27, and is electrically connected to the third via-hole conductor 27. An upper end of the fifth via-hole conductor 30 is electrically connected to the electrode land 22.

Therefore, the electrode land 22 is electrically connected to the via cover 23a at the first end of the first wire 23 via the first, third, and fifth via-hole conductors 24, 27, and 30.

An upper end of the sixth via-hole conductor 31 is electrically connected to the electrode land 21. That is, the electrode land 21 is electrically connected to the third wire 29 via the sixth via-hole conductor 31.

Figure 3B:
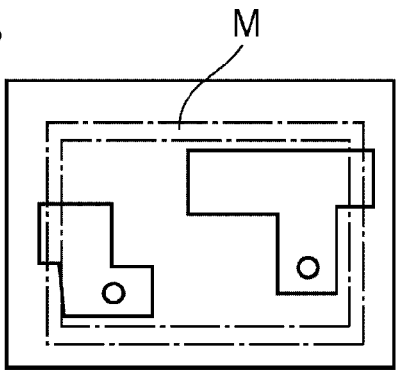
FIG. 3B is a schematic plan view explaining a coiled portion in the region where the bridging inductor is provided.
Figure 4A:
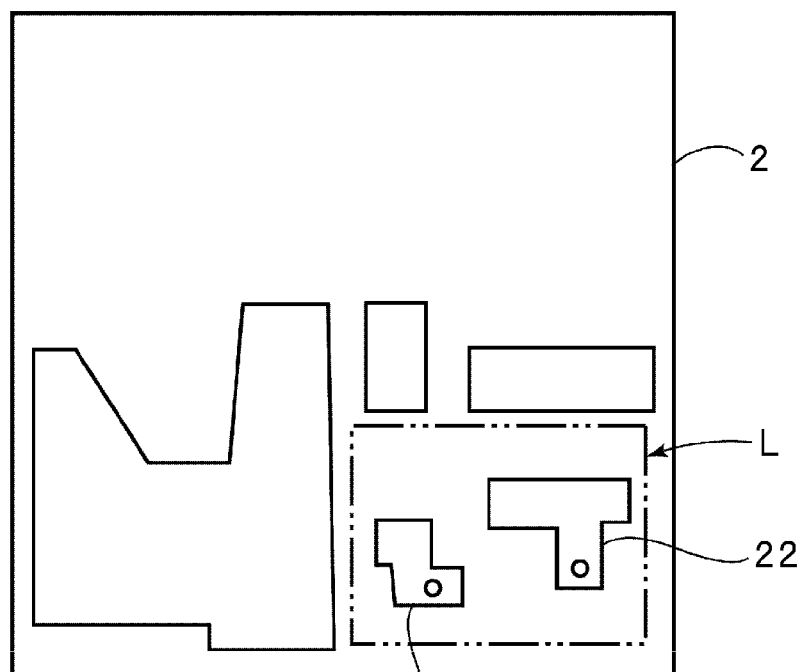
FIGS. 4A to 4D are schematic plan views explaining the electrode shapes of layers in the region where the bridging inductor is provided in the SAW duplexer according to a preferred embodiment of the present invention.
Figure 4B:
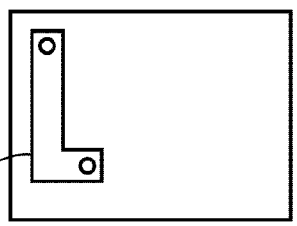
Figure 4C:
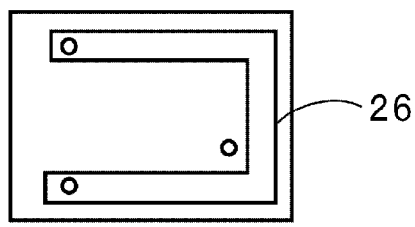
Figure 4D:
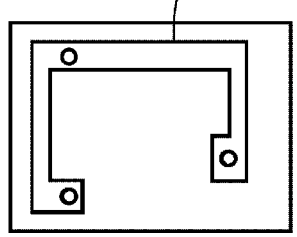
Figure 5:
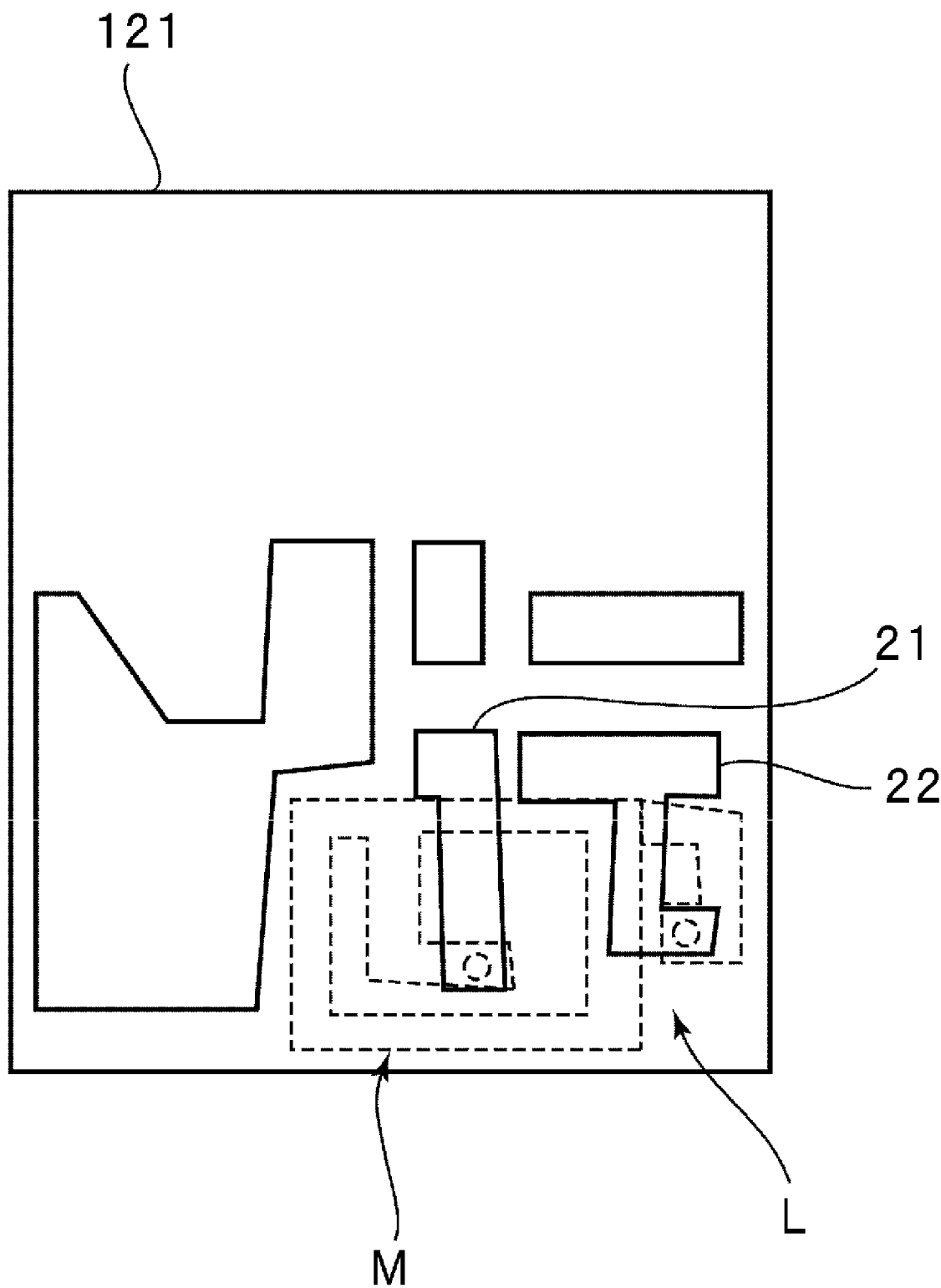
FIG. 5 is a schematic plan view showing a region where a bridging inductor L is provided in a SAW duplexer as a comparative example.
Figure 6A:
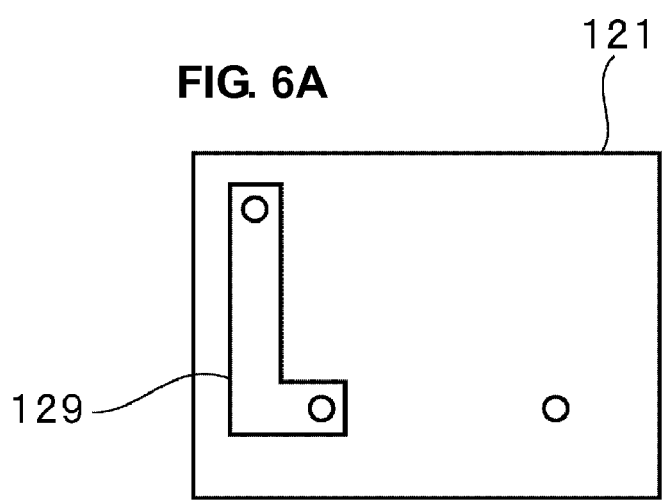
FIGS. 6A to 6C are schematic plan views showing the electrode structures of layers in the region where the bridging inductor is provided in the SAW duplexer as the comparative example.
Figure 6B:
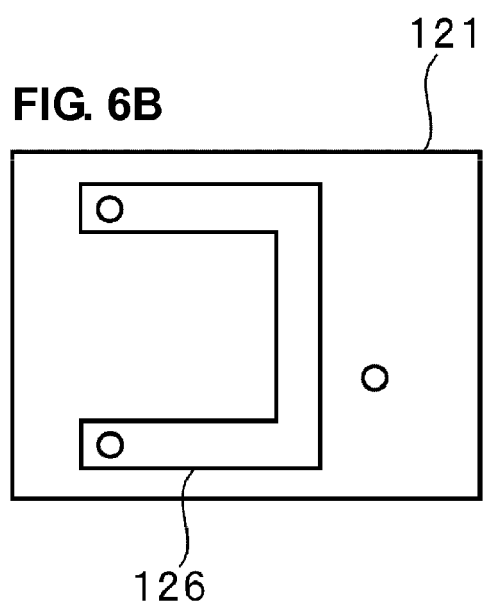
Figure 6C:
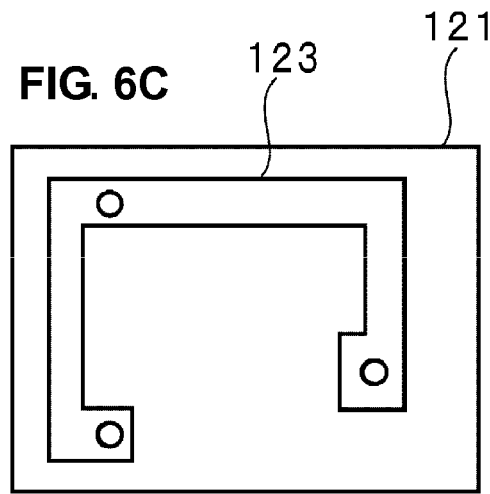

The first wire 23, the second wire 26, and the third wire 29 constitute a coiled portion of the bridging inductor L. That is, while the first wire 23, the second wire 26, and the third wire 29 are electrically connected by the second via-hole conductor 25 and the fourth via-hole conductor 28, as described above, they define a coiled portion having approximately 1.7 to 1.8 turns in plan view, as shown in FIG. 3B, thus producing an inductor component.

The first, third, and fifth via-hole conductors 24, 27, and 30 constitute a coil return wire portion that electrically connects the coiled portion to the electrode land 22 serving as one connecting end. The return wire portion is disposed inside the coiled portion M, as shown in FIG. 3B.

Therefore, in the SAW duplexer of this preferred embodiment, the coiled portion is wound on a plurality of layers, the first to third layers, in the bridging inductor L, and the coil return wire portion is disposed inside the coiled portion. Consequently, a large inductor can be obtained without increasing the area. This can further reduce the size of the multilayer package substrate 2, and can provide the small SAW duplexer 1 having a good filter characteristic.

Further, in the SAW duplexer 1 of this preferred embodiment, when the first, third, and fifth via-hole conductors 24, 27, and 30 are arranged in a straight line, the area of the region where the bridging inductor is provided can be made smaller than when the first, third, and fifth via-hole conductors 24, 27, and 30 are disposed at different positions in plan view.

As shown in FIG. 1, in the SAW duplexer of this preferred embodiment, via-hole conductors 13 connected to the ground potential are disposed between a portion where the SAW filter chip 11 including the first SAW filter F1 is mounted and a portion where the second SAW filter chip 12 including the second SAW filter F2 is mounted. The via-hole conductors 13 are connected to the ground potential, and are disposed between the first SAW filter chip 11 and the region where the bridging inductor L is provided. This can effectively increase isolation between the first SAW filter F1 and the second SAW filter F2.

The terminals of the serial resonator S3 of the SAW filter chip 12 are connected to portions J and K of the electrode lands 21 and 22 that are connected to the bridging inductor. The portions J and K and the output terminal 15 are disposed inside the coiled portion M. Therefore, the size of the SAW duplexer can be reduced further.

Since the first, third, and fifth via-hole conductors 24, 27, and 40 are disposed inside the coiled portion in this preferred embodiment, as described above, size reduction is possible. Further, since the sixth via-hole conductor 31 connected to the electrode land 21 is also disposed inside the coiled portion, the area of the region where the bridging inductor L is provided can be reduced further. The sixth via-hole conductor 31 may be disposed outside the coiled portion.

With reference to specific experimental examples, a description will be given of the fact that the SAW duplexer of this preferred embodiment can sufficiently achieve size reduction and can obtain a good filter characteristic.

A SAW duplexer 1 according to the above-described preferred embodiment preferably was produced such that the frequency of the passband of a first SAW filter F1 was about 1850 MHz to about 1910 MHz and the frequency of the passband of a second SAW filter F2 was about 1930 MHz to about 1990 MHz, for example. For comparison, a multilayer package substrate 121 serving as a comparative example shown in FIG. 5 as a plan view was prepared, and a SAW duplexer as a comparative example was produced in a manner similar to that adopted in the above-described preferred embodiment, except that the multilayer package substrate 121 was used. In the multilayer package substrate 121, components corresponding to those in the preferred embodiment are denoted by corresponding reference numerals. FIGS. 6A to 6C and FIG. 7A schematically show an electrode structure of a region of the multilayer package substrate 121 where a bridging inductor is provided.

In the multilayer package substrate 121 of the comparative example, first to third wires were formed on first to third layers, respectively, in a manner similar to that adopted in the multilayer package substrate of the above-described preferred embodiment. A coiled portion was formed by first to third wires 123, 126, and 129. The first to third wires 123, 126, and 129 were electrically connected by second and fourth via-hole conductors 125 and 128. The third wire 129 was connected to an electrode land 121 by a sixth via-hole conductor 131.

Figure 7A:
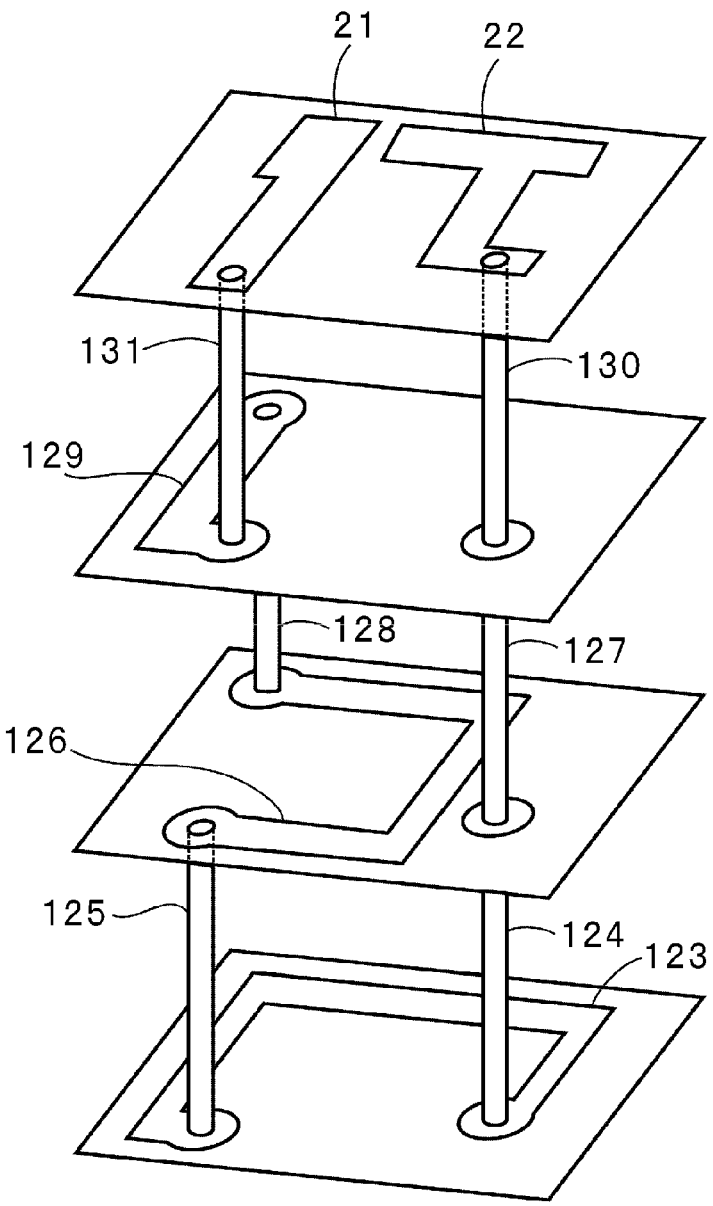
FIGS. 7A and 7B are an exploded schematic perspective view and a schematic plan view, respectively, showing the electrode structure of the region where the bridging inductor is provided in the SAW duplexer as the comparative example.
Figure 7B:
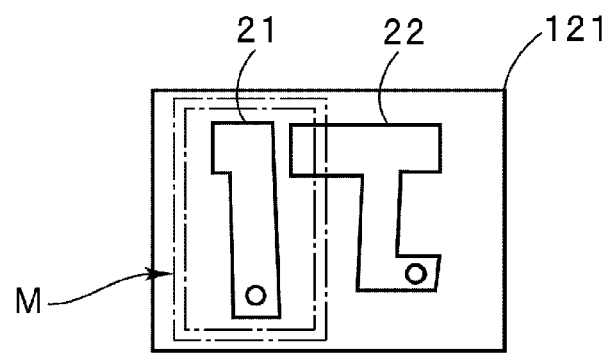

In the above-described preferred embodiment, the first, third, and fifth via-hole conductors 24, 27, and 30 are disposed inside the coiled portion so as to form a straight line. While the first, third, and fifth via-hole conductors 124, 127, and 130 in the comparative example are disposed to form a straight line, as shown in FIGS. 6A-6C, 7A and 7B, they are disposed outside the coiled portion M, as schematically shown in FIG. 7B.

That is, the SAW duplexer of the comparative example is similar to the SAW duplexer 1 of the present preferred embodiment except that the first, third, and fifth via-hole conductors 124, 127, and 130 constituting a coil return wire portion are disposed outside the coiled portion of a bridging inductor L.

Figure 8:
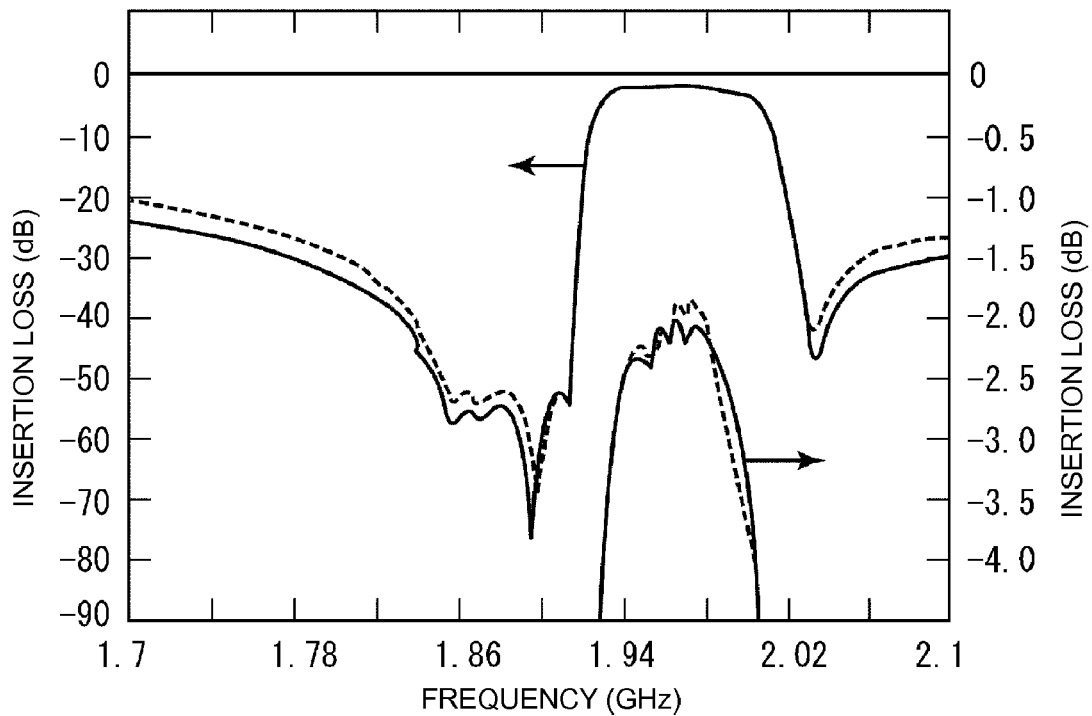
FIG. 8 is a graph showing transmission characteristics of the second SAW filters in the SAW duplexers of a preferred embodiment of the present invention and the comparative example.
Figure 9:
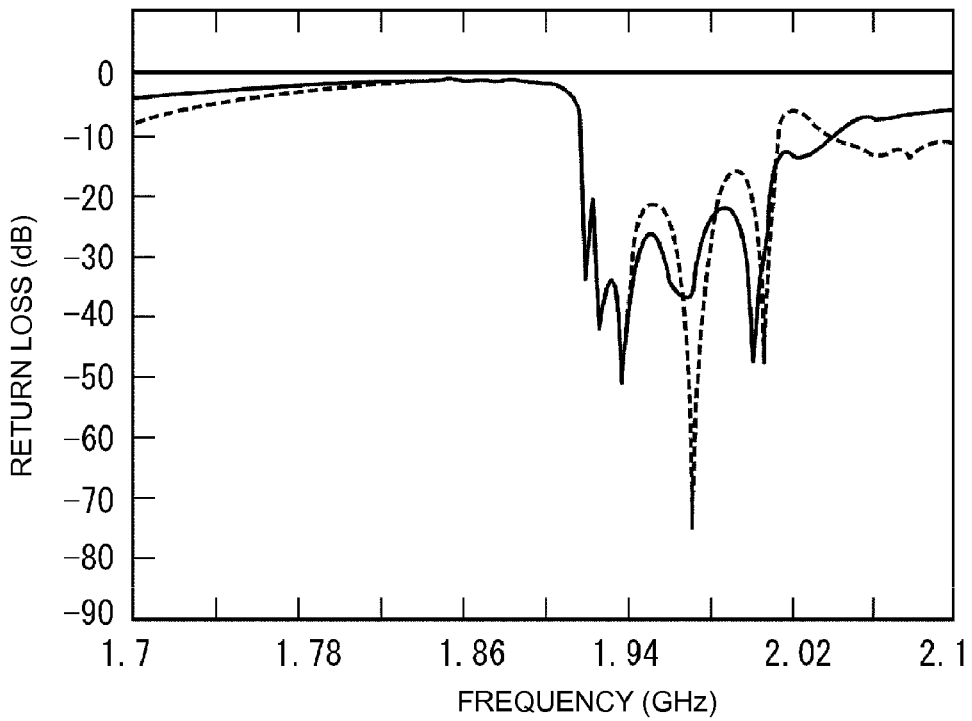
FIG. 9 is a graph showing reflection characteristics of the second SAW filters in the SAW duplexers of a preferred embodiment of the present invention and the comparative example.

FIG. 8 shows a transmission characteristic S21 of the second SAW filter F2, and FIG. 9 shows a reflection characteristic S11 thereof. In FIGS. 8 and 9, a solid line shows the result of the present preferred embodiment, and a broken line shows the result of the comparative example.

As is evident from FIG. 8, according to the present preferred embodiment, the attenuation in the low section of the passband can be made larger than in the duplexer of the comparative example.

Further, FIG. 9 shows that return loss at the receiving terminal in the passband in the SAW duplexer of the present preferred embodiment is smaller than that in the comparative example.

That is, the filter characteristic can be further improved by placing the first, third, and fifth via-hole conductors, which define the return wire portion of the bridging inductor L, inside the coiled portion, in addition to joining the bridging inductor L.

Figure 10:
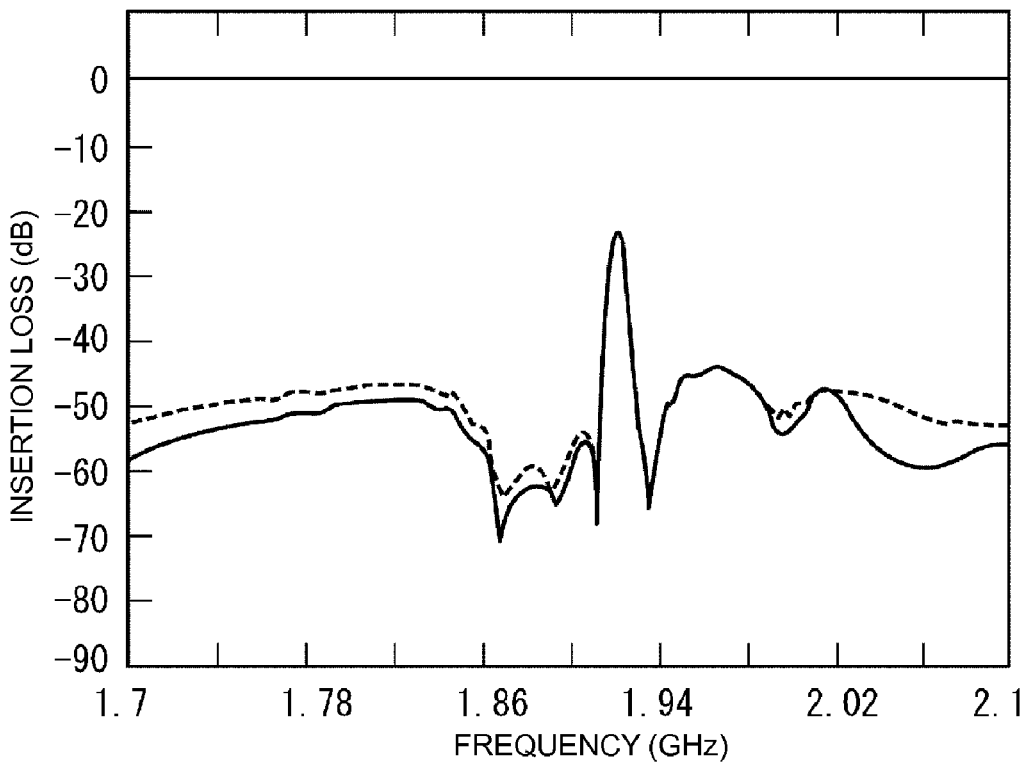
FIG. 10 is a graph showing isolation characteristics of the second SAW filters in the SAW duplexers of a preferred embodiment of the present invention and the comparative example.
Figure 11:
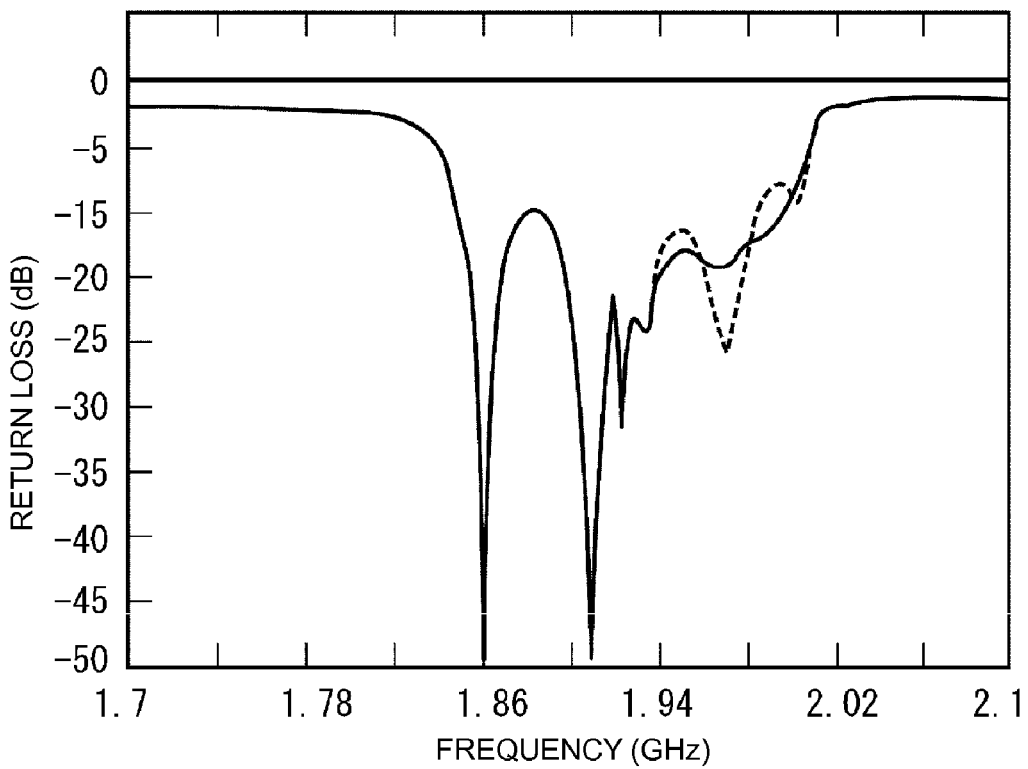
FIG. 11 is a graph showing reflection characteristics of antenna-side terminals in the SAW duplexers of a preferred embodiment of the present invention and the comparative example.

FIGS. 10 and 11 respectively show isolation characteristics of the SAW duplexers of the present preferred embodiment and the comparative example, and reflection characteristics at the antenna-side terminals. A solid line shows the result of the present preferred embodiment, and a broken line shows the result of the comparative example.

FIG. 10 shows that the present preferred embodiment can increase isolation, compared with the comparative example.

FIG. 11 shows that the return loss can be reduced at the antenna terminal.

Accordingly, since the return wire portion is disposed inside the coiled portion of the bridging inductor L in the SAW duplexer 1 of the present preferred embodiment, the filter characteristic can be further improved, compared with the SAW duplexer of the comparative example.

Figure 12:
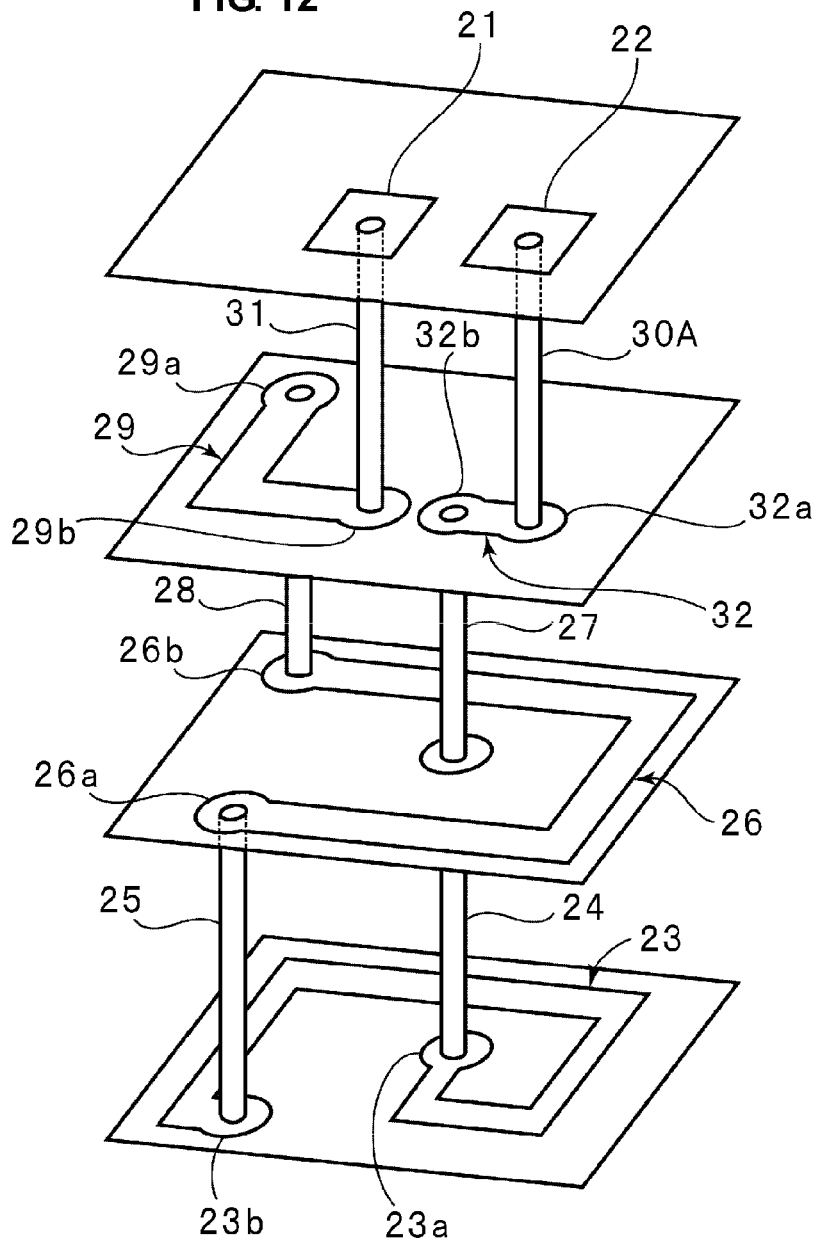
FIG. 12 is an exploded schematic perspective view showing an electrode structure of a region where a bridging inductor is provided in a modification of the SAW duplexer according to a preferred embodiment of the present invention.

While the first, third, and fifth via-hole conductors 24, 27, and 30, which define the coil return wire portion, are connected in a straight line in the present preferred embodiment, first, third, and fifth via-hole conductors 24, 27, and 30A do not always need to be connected in a straight line, as in a modification shown in FIG. 12 as an exploded perspective view.

In this modification, an upper end of the fifth via-hole conductor 30A is electrically connected to an electrode land 22, but a lower end thereof is electrically connected to a connecting wire 32. The connecting wire 32 has a via cover 32a at one end, and the via cover 32a is electrically connected to the lower end of the fifth via-hole conductor 30A. The connecting wire 32 has a via cover 32b at the other end, and the via cover 32b is electrically connected to an upper end of the third via-hole conductor 27. Therefore, the third via-hole conductor 27 and the fifth via-hole conductor 30A are connected in the form of a crank, as viewed from the front side. In other words, the first, third, and fifth via-hole conductors 24, 27, and 30A are connected so as not to form a straight line.

Figure 13:
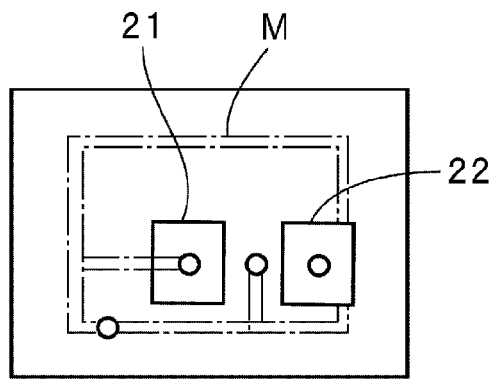
FIG. 13 is a schematic plan view of the region where the bridging inductor is provided in the modification shown in FIG. 12.

FIG. 13 is a plan view schematically showing the positional relationship among a coiled portion M, the electrode lands 21 and 22, and the via-hole conductors in the modification. In this modification, not only the first and third via-hole conductors 24 and 27, but also the fifth via-hole conductor 30A are disposed inside the coiled portion M. Therefore, the first, third, and fifth via-hole conductors 24, 27, and 30A that define a coil return wire portion are disposed inside the coiled portion.

As described above, a plurality of via-hole conductors that define the return wire portion, which electrically connects one end of the coiled portion to the terminal, do not always need to be connected in a straight line as long as the coil return wire portion is disposed inside the coiled portion. That is, when a plurality of via-hole conductors are connected so as not to form a straight line, the degree of flexibility in design can be increased.

Figure 14:
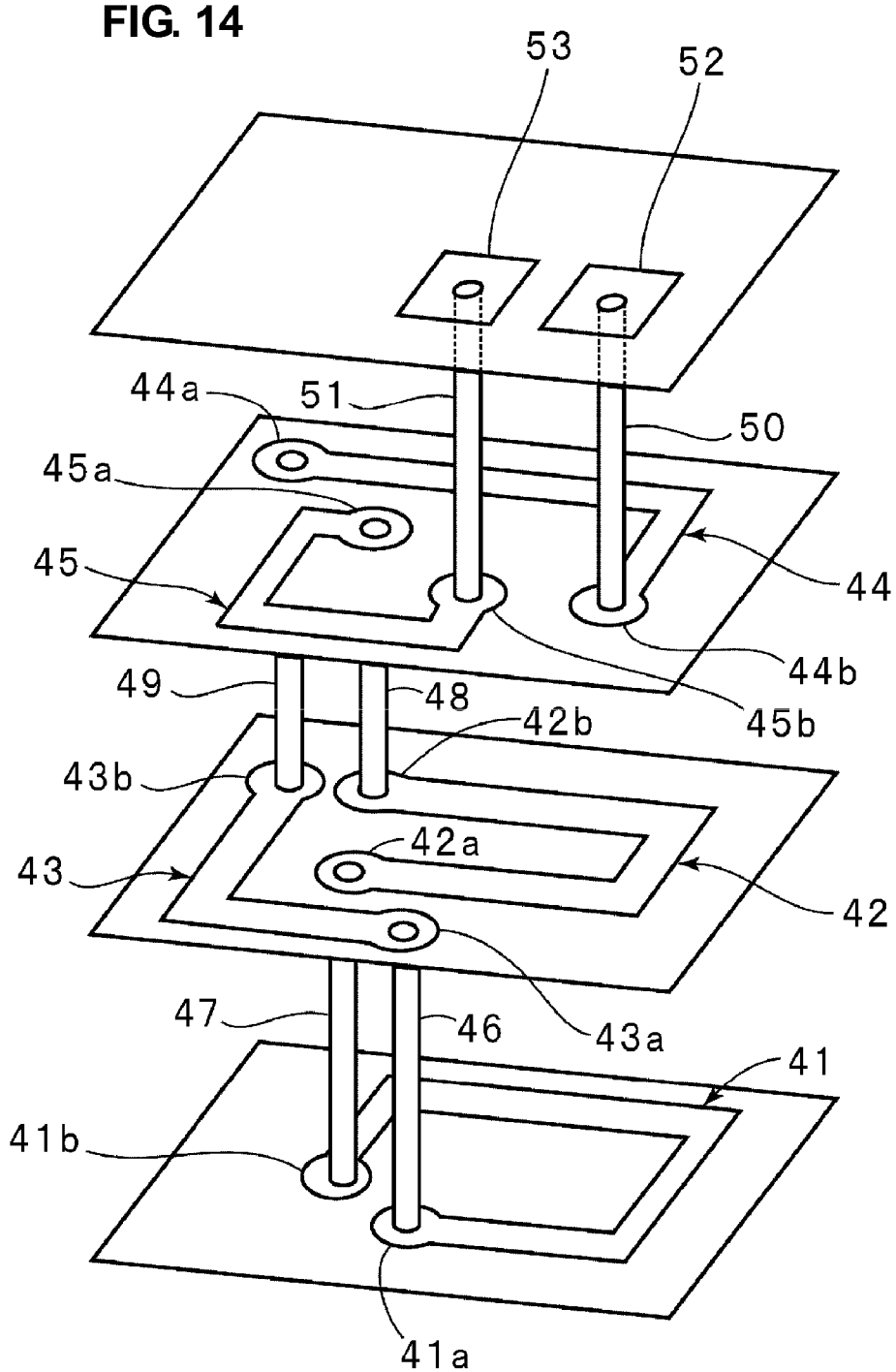
FIG. 14 is an exploded perspective view of a region where a bridging inductor is provided in another modification of the SAW duplexer according to a preferred embodiment of the present invention.
Figure 15:
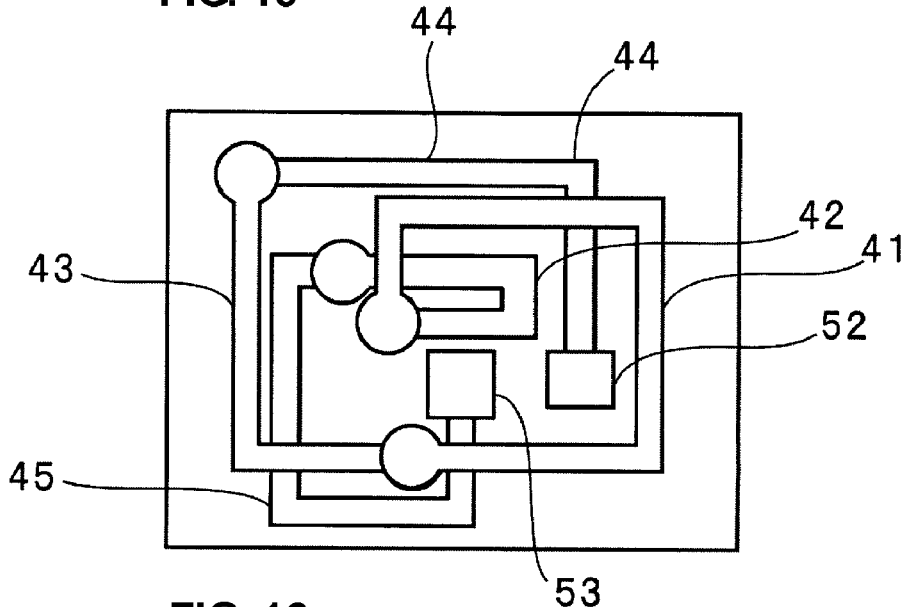
FIG. 15 is a schematic plan view of the region where the bridging inductor is provided in the modification shown in FIG. 14.
Figure 16:
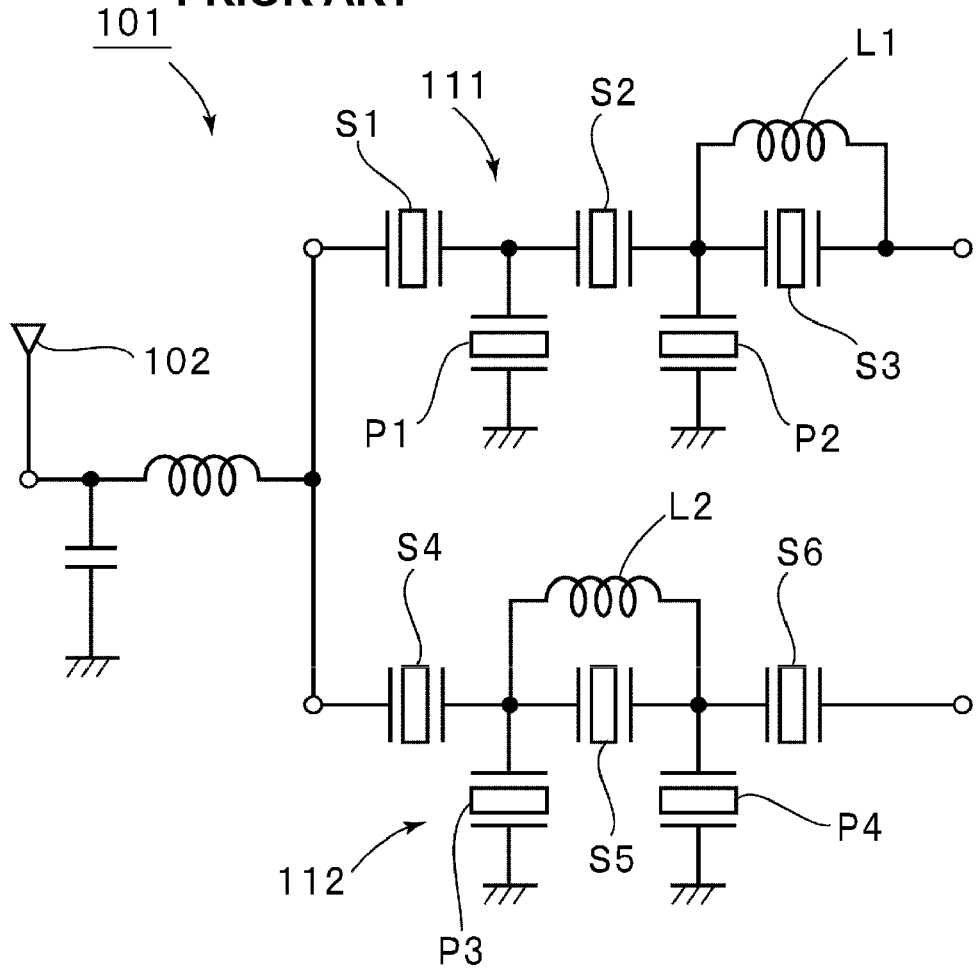
FIG. 16 is a view showing a circuit configuration of a known SAW duplexer.
Figure 17:
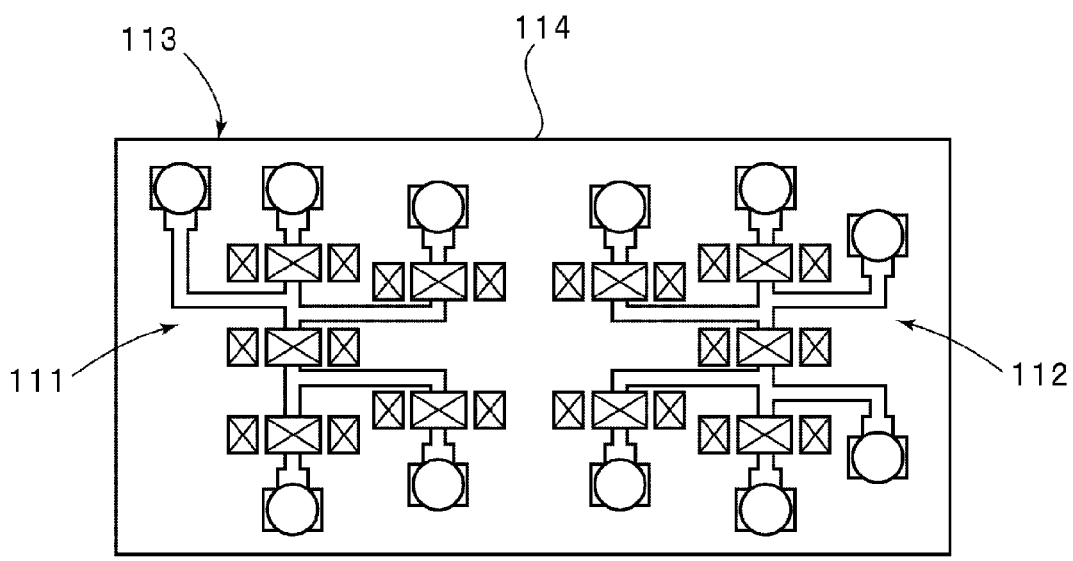
FIG. 17 is a schematic plan view of a surface acoustic wave element chip mounted on a package substrate in the known SAW duplexer.
Figure 18:
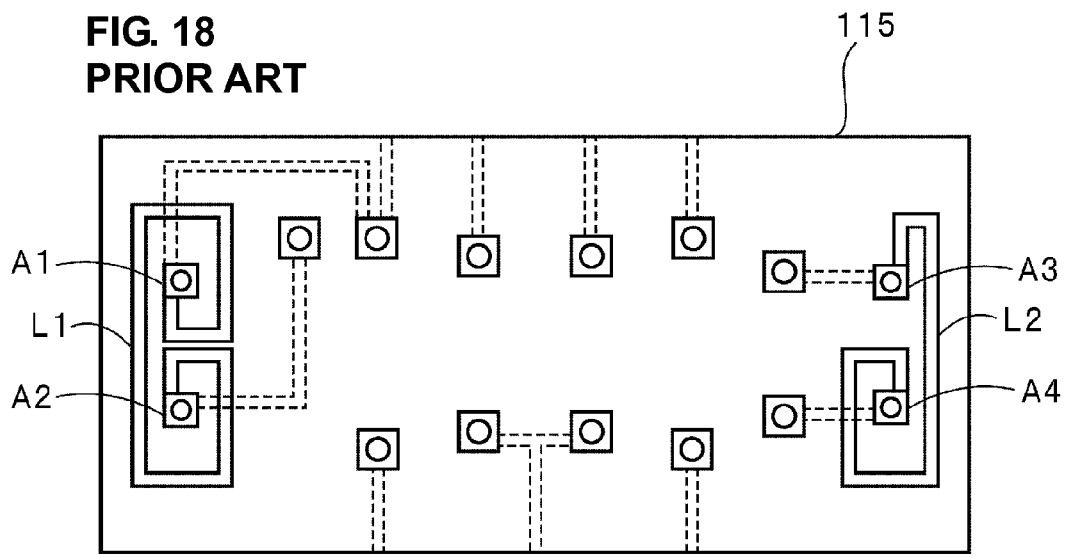
FIG. 18 is a schematic plan view of the package substrate on which the surface acoustic wave element is mounted in the known SAW duplexer.

FIG. 14 is an exploded perspective view explaining another modification of the SAW duplexer according to a preferred embodiment, and FIG. 15 is a schematic plan view of an inductor section in this modification.

In this modification, a bridging inductor L has an electrode structure shown in FIG. 14 as an exploded perspective view. That is, a first wire 41 is provided on a first layer disposed on the lower side, second wires 42 and 43 are provided on a second layer, and third wires 44 and 45 are provided on a third layer. The second wires 42 and 43 and the third wires 44 and 45 are electrically connected to the first wire 41, thus forming a coiled portion. In this way, a plurality of wires that constitute the coiled portion may be provided on one layer in preferred embodiments of the present invention. While the first to fourth wires do not overlap in the vertical direction in FIG. 15, in actuality, the wires that constitute the coiled portion overlap in the vertical direction. In FIG. 15, the wires overlapping vertically are schematically shown so as not to be adjacent to one another for an easy grasp of the positional relationship among the wires.

As shown in FIGS. 14 and 15, in this modification, a lower end of a first via-hole conductor 46 is connected to a via cover 41a connected to a first end of the first wire 41. An upper end of the first via-hole conductor 46 is electrically connected to a via cover 43a provided at a first end of the second wire 43.

A via cover 41b provided at a second end of the first wire 41 is electrically connected to a lower end of a second via-hole conductor 47. An upper end of the second via-hole conductor 47 is electrically connected to a via cover 42a provided at one end of the second wire 42. A via cover 42b provided at the other end of the second wire 42 is electrically connected to a third via-hole conductor 48. Similarly, a lower end of a fourth via-hole conductor 49 is electrically connected to a via cover 43b provided at the other end of the second wire 43.

On the third layer, a via cover 45a of the third wire 45 is electrically connected to an upper end of the third via-hole conductor 48. A via cover 44a provided at one end of the third wire 44 is electrically connected to an upper end of the fourth via-hole conductor 49. The via covers 44b and 45b provided at the other ends of the third wires 45 and 44 are respectively electrically connected to electrode lands 52 and 53 by fifth and sixth via-hole conductors 50 and 51.

Therefore, a coiled portion defined by the first to third wires 41 to 45 is electrically connected between the electrode land 52 and 53. A return wire portion that connects the coiled portion to the electrode land 53 serving as a connecting terminal of the inductor includes the sixth via-hole conductor 51. The sixth via-hole conductor 51 is disposed inside the coiled portion.

While a plurality of wires are provided on the second and third layers, as described above, they are electrically connected in series on the first layer. By forming a plurality of wires on at least one layer in this way, the line length of the coiled portion can be increased, and a larger inductance can be obtained.

When a plurality of coil patterns are provided, as in the modification shown in FIGS. 14 and 15, it is satisfactory as long as the return wire portion is disposed inside the outer peripheral edges of a plurality of coiled portions. Therefore, when a plurality of coiled portions are thus provided, the structure in which the return wire portion is disposed inside the coiled portion refers to a structure in which the return wire portion is disposed inside the outer peripheral edges of the coiled portions.

While the fourth layer having the electrode lands is provided on the third layer in the above-described preferred embodiment, one or more layers that constitute the coiled portion may be provided between the third layer and the fourth layer having the electrode lands so as to form a coiled portion with more turns.

The number of steps in the ladder-shaped circuit configuration is not limited to that adopted in the above-described preferred embodiment.

Further, both the first and second SAW filters may be provided on one chip.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A SAW duplexer comprising:
   a first SAW filter having a ladder-shaped circuit configuration including at least one serial arm resonator and at least one parallel arm resonator, and having a passband with a relatively low frequency;
   a second SAW filter having a ladder-shaped circuit configuration including at least one serial arm resonator and at least one parallel arm resonator, and having a passband with a relatively high frequency; and
   a bridging inductor connected in parallel to the at least one serial arm resonator in the second SAW filter; wherein
   the first SAW filter and the second SAW filter are defined by SAW filter chips;
   the SAW duplexer further includes a multilayer package substrate on which the SAW filter chips are mounted; and
   the bridging inductor includes:
      a first wire provided on a first layer of the multilayer package substrate;
      a first via-hole conductor connected to one end of the first wire;
      a second via-hole conductor connected to the other end of the first wire; and
      a second wire provided on a second layer of the multilayer package substrate at a height that is different from a height of the first layer and connected at one end to the second via-hole conductor;
      a third via-hole conductor connected to the first via-hole conductor;
      a fourth via-hole conductor connected to the other end of the second wire; and
      a third wire connected at one end to the fourth via-hole conductor and provided on a third layer of the multilayer package substrate at a height that is different from the heights of the first and second layers; wherein
   a coil return wire portion including at least the first and third via-hole conductors is disposed inside a coiled portion including the first wire, the second wire, and the third wire.

2. The SAW duplexer according to claim 1, wherein a fifth via-hole conductor is connected at one end to the third via-hole conductor, a sixth via-hole conductor is connected at one end to the other end of the third wire, and the other ends of the fifth via-hole conductor and the sixth via-hole conductor reach a fourth layer provided at a height that is different from the heights of the first to third layers.

3. The SAW duplexer according to claim 2, wherein the sixth via-hole conductor is disposed inside the coiled portion.

4. The SAW duplexer according to claim 1, wherein the return wire portion includes a plurality of via-hole conductors, and the via-hole conductors are linearly connected in the return wire portion.

5. The SAW duplexer according to claim 1, wherein the return wire includes a plurality of via-hole conductors, and the via-hole conductors are connected so as not to form a straight line in the return wire portion.

6. The SAW duplexer according to claim 1, wherein a via-hole conductor connected to a ground potential is disposed between the wires that define the bridging inductor and a portion of the multilayer package substrate on which the first SAW filter chip is mounted.

7. The SAW duplexer according to claim 1, wherein an electrical connecting portion of the package connected to a terminal of the serial arm resonator to which the bridging inductor is connected is disposed inside the coiled portion of the bridging inductor in the second SAW filter.

* * * * *